United States Patent [19]
Lur et al.

[11] Patent Number: 5,554,566
[45] Date of Patent: Sep. 10, 1996

[54] METHOD TO ELIMINATE POLYCIDE PEELING

[75] Inventors: Water Lur, Taipei; Cheng H. Huang, Hsin-Chu, both of Taiwan

[73] Assignee: United Microelectronics Corporation, Hsin-Chu, Taiwan

[21] Appl. No.: 301,537

[22] Filed: Sep. 6, 1994

[51] Int. Cl.$^6$ .................................................. H01L 21/28
[52] U.S. Cl. .......................... 437/193; 437/200; 437/967; 437/977; 437/233
[58] Field of Search ............................ 437/60, 200, 967, 437/977, 46, 193, 233; 257/755, 757, 770, 377

[56] References Cited

U.S. PATENT DOCUMENTS

| | | | |
|---|---|---|---|
| 4,766,006 | 8/1988 | Gaczi | 437/200 |
| 4,818,723 | 4/1989 | Yen | 437/200 |
| 4,900,257 | 2/1990 | Moedo | 437/200 |
| 5,089,432 | 2/1992 | Yoo | 437/40 |
| 5,089,441 | 2/1992 | Moslehi | 437/247 |
| 5,091,763 | 2/1992 | Sanchez | 437/193 |
| 5,130,266 | 7/1992 | Huang et al. | 437/44 |
| 5,221,365 | 6/1993 | Noguchi et al. | 437/977 |
| 5,254,503 | 10/1993 | Kenney | 437/977 |
| 5,290,729 | 3/1994 | Hoyashide et al. | 437/977 |
| 5,385,863 | 1/1995 | Tatsumi et al. | 437/977 |
| 5,422,311 | 6/1995 | Woo | 437/193 |
| 5,441,904 | 8/1995 | Kim et al. | 437/193 |

FOREIGN PATENT DOCUMENTS

| | | | |
|---|---|---|---|
| 63-260052 | 10/1988 | Japan | 437/200 |
| 03-209834 | 9/1991 | Japan | 437/200 |
| 06-140355 | 5/1994 | Japan | 437/200 |

OTHER PUBLICATIONS

S. Wolf, "Silicon Processing for the VLSI Era, vol. I", Lattice Press, 1986, pp. 175–182, 384, 385, 392, 393.
"A Novel Stacked Capacitor With Porous–Si Electrodes For High Density DRAMS" in Symposium on VLSI Technology 1993, pp. 17–18.

*Primary Examiner*—George Fourson
*Assistant Examiner*—Thomas G. Bilodeau
*Attorney, Agent, or Firm*—William H. Wright

[57] ABSTRACT

A method for forming MOSFET devices, with an improved polycide gate has been accomplished. The polycide structure, made with metal silicide on polysilicon has a reduced rate of adhesion loss or peeling of the metal silicide from the underlying polysilicon, due to the unique surface of the polysilicon. The desired surface of the polysilicon, that will reduce the peeling phenomena, is a wavy or undulated surface. This is accomplished by either depositing the polysilicon at conditions that result in a hemi-spherical grained surface, or obtaining a similar wavy or undulated surface by treating smooth polysilicon in either phosphoric acid or by anodization in hydrofluoric acid. The adhesion of the subsequent metal silicide to the wavy surface of the polysilicon is improved to a point where peeling of the metal silicide from the underlying polysilicon is eliminated.

13 Claims, 2 Drawing Sheets

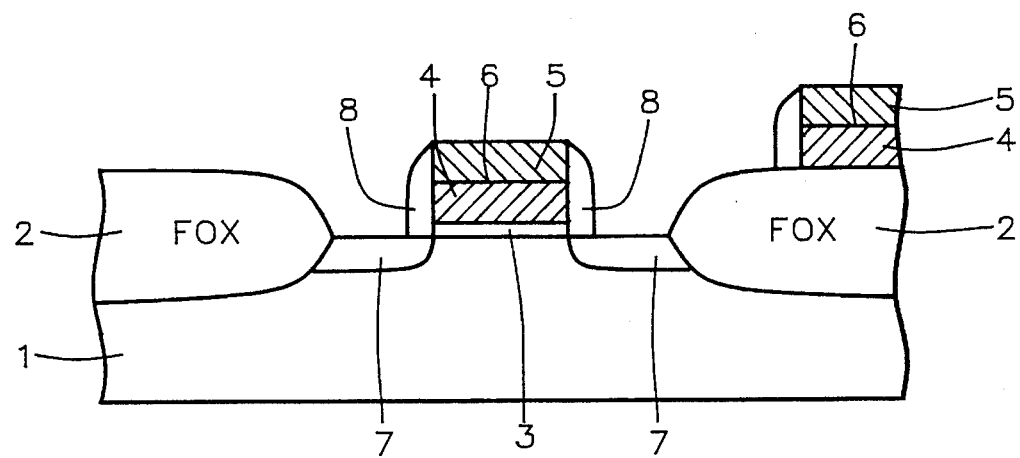
FIG. 1 – Prior Art
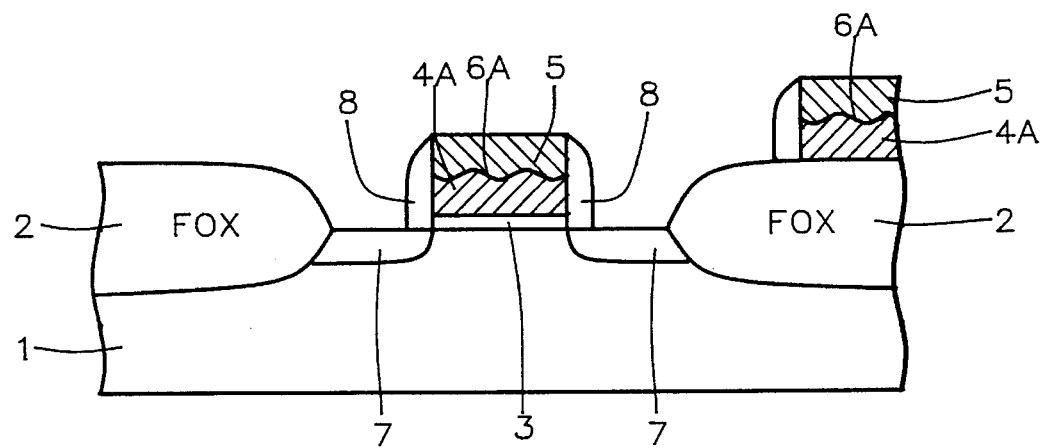
FIG. 2

METHOD TO ELIMINATE POLYCIDE PEELING

BACKGROUND OF THE INVENTION (1) Field of the Invention

The present invention relates to a process in which Metal Oxide Semiconductor Field Effect Transistors, (MOSFET), devices cart be fabricated using a bilayer structure, a refractory metal silicide on doped polysilicon, for the gate electrode.

(2) Description of Prior Art

Very large scale integration, (VLSI), has helped the semiconductor chip industry increase circuit density while still reducing cost. This has been accomplished in part by advances in lithographic disciplines, reducing image dimension and therefore ultimately reducing chip size and cost. Another factor in the VLSI optimization cycle has been the use of less resistive elements, specifically the use of polycides for gate electrodes. The reduction in resistance for a polycide gate can be as much as 10× when compared to polysilicon gate counterparts.

Polycide, which is a bilayer structure comprising a refractory metal silicide on doped polysilicon, can be created by several techniques. A metal, such as titanium, (Ti), or tungstens, (W), can be deposited on a polysilicon film, then annealed at a temperature high enough to form the metal silicide. This process can be performed to a level in which either total consumption of the polysilicon occurs, resulting in a layer of just the metal silicide, or where only partial consumption of the polysilicon occurs resulting a bilayer structure of silicide-polysilicon. The extent of the polysilicon consumption is a function of the time and temperature of the reaction. This process is sometimes referred to as the Self Aligned silicide, or SAlicide method. The self alignment is a result of silicide forming only on regions where the metal interfaces exposed silicon, during some thermal treatment, while remaining unreactive on the insulator surface. A selective wet etch is then used to remove the unreacted metal, while the metal silicide remains intact.

Another technique for obtaining polycides is via deposition of the metal silicide. This is accomplished by sputtering, evaporation or low pressure chemical vapor deposition, (LPCVD), of the metal silicide. This technique is not self aligned, since a blanket deposition is performed. Therefore a patterning process, using reactive ion etching, (RIE), is used to obtain the desired shapes of the metal silicide on polysilicon. This method of forming polycides has been shown by C. Yoo et al in U.S. Pat. No. 5,089,432, and by Watanabe et al in an article entitled "A Novel Stacked Capacitor with Porous-Si Electrodes for High Density DRAMS", in "Symposium on VLSI Technology", 1993, pp 17–18.

A major problem with polycide technology has been the lack of adhesion, or subsequent peeling of the refractory metal silicide from the the underlying doped polysilicon surface. The peeling occurs as a result of the relaxation of thermal stress between the metal silicide and the polysilicon layers. Factors enhancing the adhesion loss are the high level of dopant at the polysilicon surface and the native oxide at the polysilicon surface.

It is therefore an object of this invention to provide a method for fabricating devices with polycides that overcome this peeling or adhesion loss phenomena.

SUMMARY OF THE INVENTION

It is an object of this invention to provide a method of manufacturing a semiconductor device which will have polycide gate electrodes, or interconnects, that have excellent adhesion between the the metal silicide layer and the underlying polysilicon layer. The improved adhesion, and the reduced peeling phenomena result from a polysilicon surface that is wavy or undulated. This surface allows a less stressed interface to be produced, after metal silicide deposition, and thus less adhesion loss during subsequent high temperature processing.

It is also an object of this invention to deposit a polysilicon layer that results in a hemi-spherical grain, (HSG), thus producing an undulated or wavy polysilicon surface.

It is another object of this invention to produce a porous polysilicon surface by treating a smooth or HSG polysilicon surface in a phosphoric acid, (H3PO4), solution.

It is still another object of this invention to produce a porous polysilicon surface by anodization of a smooth or HSG polysilicon surface, in a hydrofluoric acid, (HF), solution.

It is yet another object of this invention to form or deposit a refractory metal silicide on the wavy or undulated polysilicon surface.

In accordance with this present invention a method is described for fabricating MOSFET devices in which, after completion of the gate oxide process, a polysilicon layer is deposited by LPCVD. The process conditions used for the depositon result in a polysilicon layer exhibiting a hemispherical grain surface. Another alternative of this invention is to deposit a standard, non HSG, polysilicon film and then subject to treatments that will result in polysilicon surfaces similar to the surfaces obtained via HSG processing. The methods used to convert the smooth polysilicon surface to an undulated or wavy form, similar to the HSG surface, is by treatment in phosphoric acid solution or by anodization in a hydrofluoric acid solution. This invention also can be accomplished by subjecting a HSG polysilicon surface to the phosphoric acid or anodization processes to further enhance the undulation or waviness of the polysilicon surface. The polysilicon layer is now subjected to ion implantation, to dope the gate, followed by either the deposition of a metal silicide, (MSIx), or by deposition of the metal followed by annealing to form the MSix structure. Subsequent processing, patterning the polycide, forming the source-drain regions, insulating and forming contacts to the gate electrode and source and drian regions, complete the formation of the MOSFET.

BRIEF DESCRIPTION OF THE DRAWINGS

The object and other advantages of this invention are best explained in the preferred embodiment with reference to the attached drawing that include:

FIG. 1, which schematically illustrates prior art, a cross-section of a MOSFET polycide gate comprising a metal silicide—polysilicon interface in which the polysilicon surface is smooth.

FIGS. 2–3, which schematically show the cross-section of a MOSFET polycide gate comprising a metal silicide—polysilicon interface in which the polysilicon surface is wavy or undulated.

DESCRIPTION OF THE PREFERRED EMBODIMENTS

Figure 3:
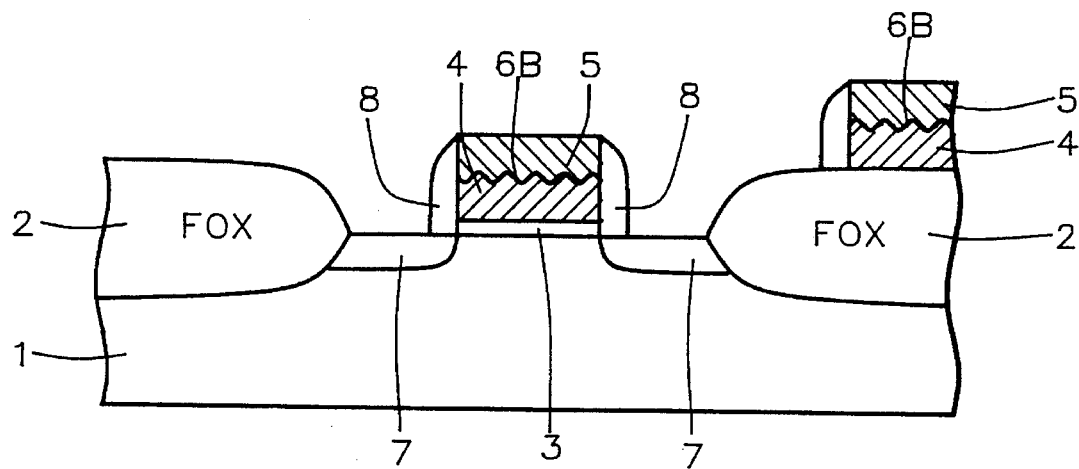

The method of forming MOSFETS with reduction or elimination of polycide peeling will now be covered in detail. This polycide structure can be used as part of a MOSFET device that is now currently being manufactured in industry, therefore only the specific areas unique to understanding this invention will be described in detail.

FIG. 1 shows the prior art where a cross-sectional view of a polycide structure on a gate oxide is depicted. A substrate, 1, composed of P type single crystal silicon with a <100> orientation, is used. A thick field oxide, 2, (FOX), for isolating the device, is first formed surrounding the region where the device is to be built. Briefly, the method commonly practiced in the industry is to use a thin thermal oxide, (pad oxide), and a silicon nitride, (Si3N4), layer, as an oxidation mask. The desired field oxide regions are etched open in the nitride-oxide layer using conventional photo lithographic techniques and dry etch processing. After removal of the masking photoresist, and a chemical cleaning, a field oxide is grown, typically to a thickness of about 4000 to 6000 Angstroms.

After removal of the nitride-oxide layer, via a heated solution of phosphoric acid, for the silicon nitride, and a buffered or dilute hydroflouric acid, (HF), for the pad oxide, another wet chemical clean is performed, followed by a carefully grown gate oxide, 3. Next a polysilicon film, 4, is deposited and doped to a desired level. An anneal process is performed to activate the dopant in polysilicon. After a wet chemical clean a metal silicide, 5, such as tungsten silicide, WSi2, is deposited. It should be noted that the interface, shown as 6, between the metal silicide, 5, and polysilicon, 4, is smooth. This is due to the process conditions used to deposit the polysilicon layer 4. The MOSFET device processing then continues by patterning the polycide gate, (metal silicide-polysilicon) via use of conventional photolithograhy and reactive ion etching, (RIE). Source and drain regions, 7, are then fabricated using conventional ion implantation processing. The formation of a polycide insulator spacer, 8, created by deposition of an insulator, such as silicon dioxide, and an anisotropic RIE procedure, is then accomplished. Finally standard processing is performed to create the metallization of this MOSFET device, (not shown in FIG. 1). However interface 6, shown in this prior art description, sometimes can influence an adhesion loss or peeling of the metal silicide 5, from the polysilicon, 4, as a result of the smooth polysilicon surface and the subsequent processing conditions.

FIG. 2, cross-sectionally represents a first embodiment solution to the peeling problem. Again, as shown previously in FIG. 1, a substrate, 1, is used and the field oxide region, 2, is created. After a wet chemical clean of of the silicon surface, a gate oxide, 3, is grown at a temperature between about 800° to 1050° C., to a thickness of about 30 to 1000 Angstroms. A polysilicon layer, 4a, is now grown by low pressure chemical vapor deposition, (LPCVD), via use of silane gas, SiH4, at a temperature between about 580° to 600° C., to a thickness of about 500 to 4000 Angstroms. These deposition conditions result in a polysilicon layer, 4a, having a hemi-spherical grained, HSG, surface. After doping of the polysilicon layer, 4a, by ion implantation, (I/I), using arsenic or phosphorous at an energy of between about 15 to 200 Kev, at a dose of about 5E14 to 5E15 atoms/cm2, an anneal cycle, at a temperature between about 700° to 1000° C., is used to activate the dopants. After a wet chemical cleanup, metal silicide, 5, such as tungsten silicide, WSi2, is deposited using low pressure chemical vapor deposition. The film is grown using silane and tungsten hexafluoride at a temperature between about 300° to 450° C., a pressure of 200 to 400 mtorr., and to a thickness of about 500 to 3000 Angstroms. It should be noted that the interface, 6a, between the metal silicide, 5, and polysilicon, 4a, is not smooth, as was the case in FIG. 1, the prior art. In FIG. 2 the interface 6a is wavy or undulated. This type of interface will not result in peeling or lack of adhesion between the metal silicide, 5, and the polysilicon layer, 4a, during subsequent processing.

Again as described for FIG. 1, additional processing, identical to conditions used for the structure shown in FIG. 1, is performed to complete the MOSFET device. The polycide gate structure is formed using photolithograhy and RIE processing. Source and drain regions, 7, are formed, and a insulator spacer, 8, is created. Metallization processing, needed to provide the contacts to the source and drain, as well as the polycide gate, (not shown in FIG. 2), is then used to complete the device.

FIG. 3 schematically shows a second embodiment solution to the peeling problem via the creation of a wavy or undulated polysilicon surface. Again as previously described a substrate 1, with FOX regions, 2, and gate oxide, 3 are used. The polysilicon layer can be either layer 4, shown in FIG. 1, or polysilicon layer 4a, described in FIG. 2. Polysilicon doping steps, and dopant activation steps, previously described, are again used for this embodiment. At this stage there are two methods that can be used to convert smooth surfaced polysilicon layer 4, to a wavy surface, or to make the already undulated surface of polysilicon layer 4a, more wavy or undulated. A first method consists of subjecting the polysilicon to a bath of phosphoric acid, H3PO4, at a temperature between about 130° to 180° C., for about 5 to 120 min. This treatment will result in interface 6b, shown in FIG. 3. A second method, anodization, at a current density of about 5 to 50 milliamps/cm2, for 2 to 10 min., in hydrofluoric acid, HF, will also result in interface 6b. In addition, interface 6b can also be obtained wherein a polysilicon layer with a smooth surface is treated to convert the surface topography to a substantially undulated surface by native oxide stripping and annealing at a temperature between about 550° to 650° C., at a pressure below about 1E-6 Torr. Now after a wet chemical clean a metal silicide layer, 5, is deposited. The metal silicide can be titanium silicide, molybdenum silicide, or as previously shown, tungsten silicide. Again, for this embodiment WSi2 will be used and the deposition conditions will be identical to those previously described. The interface, 6b, between metal silicide layer 5, and polysilicon layer 4, is wavy and undulated, thus subsequent processing steps needed to complete the MOSFET device will not result in peeling or lack of adhesion of these layers.

Again, as previously shown, additional processing, identical to descriptions presented in FIG. 1 and FIG. 2, are used to complete the MOSFET. The result of the polycide gate patterning, source and drain regions 7, and spacer insulator 8, formation are shown in FIG. 3.

Figure 4:
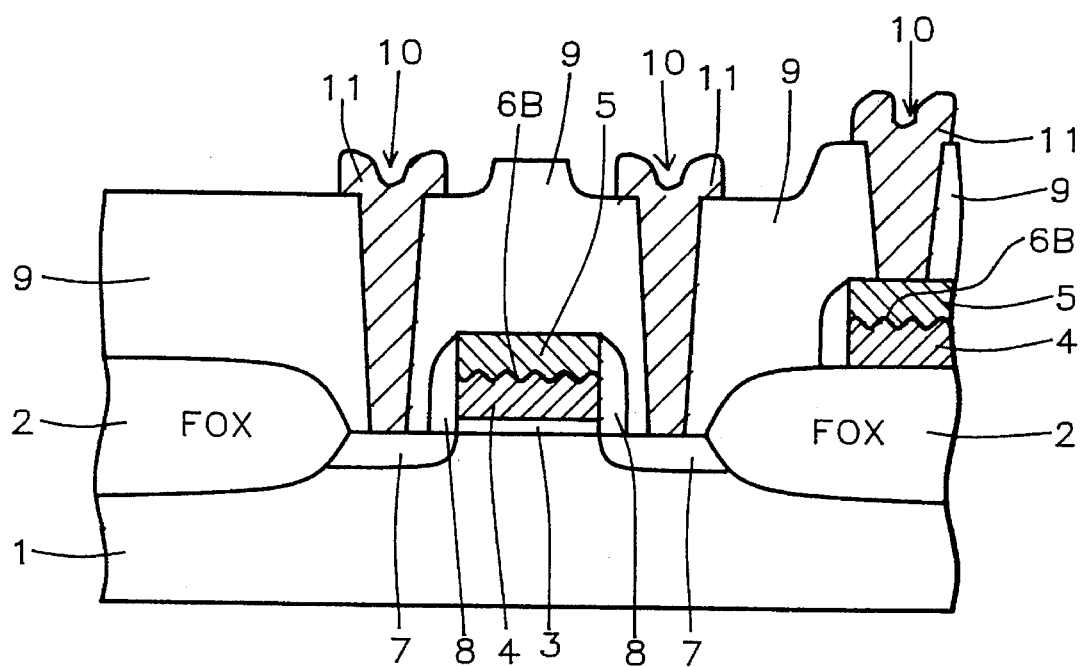
FIG. 4 schematically represents a metallized MOSFET device, in which the polycide structure is fabricated using a wavy or undulated polysilicon surface.

FIG. 4 schematically shows a metallized MOSFET device, in which the polycide structure is comprised of a metal silicide, WSi2 for this case, on a wavy or undulated polysilicon surface. Using identical processing as shown for FIG. 3, after spacer insulator formation, a layer of atmospheric pressure or low pressure chemical vapor deposited, (APCVD or LPCVD), silicon dioxide, 9, is deposited at a temperature of about 400° C. to 750° C., to a thickness of 4000 to 10000 Angstroms. Standard photolithographic techniques are used again, along with a RIE process, using CHF3+Ar, or the like, to produce contact holes, 10, to the metal silicide, 5, on the polycide structure, as well as to the source and drain regions, 7. Metal is deposited using either evaporation, sputtering or CVD techniques. The metalllurgy can be Ti/TiN, or Ti/Ti:W, under aluminum alloy at a thickness of 1000 and 5000–10000 Angstroms, respectively. Standard photolithographic and metal RIE processing are performed to result in metal contacts, 11, and interconnects. The RIE processing can be accomplished using Cl2 and BCl3, or the like.

This process, for the elimination of polycide peeling, or the lack of adhesion between the metal silicide and the underlying polysilicon layer, can be applied to N type, (NFET), or P type, (PFET), devices, as well as to complimentary, (CMOS), structures. In addition BiCMOS devices can also be fabricated using this invention.

While this invention has been particularly shown and described with reference to the preferred embodiments thereof, it will be understood by those skilled in the art that various changes in form and details may be made without departing from the spirit and scope of this invention.

What is claimed is:

1. A method for forming an improved polycide structure including a polysilicon layer and a metal silicide layer comprising:

forming said polysilicon layer by chemical vapor deposition at a temperature between about 580° to 600° C., at a pressure below about 300 mTorr, to a thickness between about 500 to 4000 Angstroms and resulting in a hemispherical grained polysilicon surface as deposited;

depositing said metal silicide layer on said hemispherical grained polysilicon surface; and patterning to form said polycide structure.

2. A method for fabricating a device on a semiconductor substrate, with a polycide structure, comprising:

forming a polysilicon layer by chemical vapor deposition at a temperature below 580° C. or above 600° C., at a pressure below 300 mTorr, to a thickness of about 500 to 4000 Angstroms, and resulting in a non-hemispherical polysilicon surface as deposited;

dipping said polysilicon layer in a solution of phosphoric acid at a temperature between about 130° to 180° C., to convert surface of said polysilicon layer from non-hemispherical to a hemispherical surface;

depositing a metal silicide on said polysilicon layer; and patterning to form said polycide structure.

3. A method for fabricating a device on a semiconductor substrate, with a polycide structure in which the metal silicide is deposited on a hemispherical grained polysilicon surface, comprising:

forming said polysilicon layer by chemical vapor deposition at a temperature between about 580° to 600° C., at a pressure below about 300 mTorr, to a thickness of about 500 to 4000 Angstroms and resulting in a hemispherical grained polysilicon surface;

modifying the said hemispherical grained polysilicon surface to increase the level of the hemispherical grains;

depositing metal silicide on said hemispherical grained polysilicon; and patterning to form said polycide structure.

4. The method of claim 1, wherein said polysilicon layer is doped to be conductive by a method selected from the group consisting of in-situ doping during deposition, post deposition doping using thermal diffusion, and post deposition doping using ion implantation followed by thermal activation.

5. The method of claim 4, wherein said conductive polysilicon layer is in-situ doped with an impurity selected from the group consisting of arsenic, phosphorus, and boron, to a concentration of between about 1E19 to 1E21/cubic cm.

6. The method of claim 4, wherein said conductive polysilicon layer is post-deposition doped using thermal diffusion with an impurity selected from the group consisting of arsenic, phosphorus, and boron, to a concentration of between about 1E19 to 1E21/cubic cm.

7. The method of claim 4, wherein said conductive polysilicon layer is formed by ion implantation with ions selected from the group consisting of phosphorus, arsenic, boron, and $BF_2$, at an energy of between about 10 to 200 Kev and a dose of 5E14 to 1E16/square cm., followed by thermal activation.

8. The method of claim 1, wherein said polysilicon layer with hemi-spherical grained surface is treated in a solution of phosphoric acid at a temperature between about 130° to 180° C.

9. The method of claim 1, wherein said polysilicon layer with hemi-spherical grained surface is anodized in hydrofluoric acid at a temperature between about 10° to 150° C. at a current density of between about 5 to 50 mA/square cm.

10. The method of claim 1, wherein said metal silicide is deposited at a temperature below about 500° C.

11. The method of claim 1, wherein said metal silicide is comprised substantially of silicides from the group consisting of titanium silicide, molybdenum silicide, tantalum silicide and tungsten silicide, to a thickness of about 500 to 3000 Angstroms.

12. A method for fabricating a device on a semiconductor substrate, with a polycide structure, comprising:

forming a polysilicon layer by chemical vapor deposition at a temperature below 580° C., or above 600° C., at a pressure below 300 mTorr, to a thickness between about 500 to 4000 Angstroms, resulting in a non-hemispherical polysilicon surface as deposited;

anodizing in hydrofluoric acid at a temperature between about 10° to 150° C., at a current density between about 5 to 50 mA/cm$^2$, to convert surface of said polysilicon layer from non-hemispherical to a hemispherical surface;

depositing a metal silicide on said polysilicon layer; and patterning to form said polycide structure.

13. A method for fabricating a device on a semiconductor substrate, with a polycide structure, comprising:

forming a polysilicon layer by chemical vapor deposition at a temperature below 580° C., or above 600° C., at a pressure below 300 mTorr, to a thickness between about 500 to 4000 Angstroms, resulting in a non-hemispherical polysilicon surface as deposited;

removal of a native oxide from the surface of said polysilicon layer;

annealing at a temperature between about 550° to 650° C., at a pressure below about $10^{-6}$ Torr, to convert the surface of said polysilicon layer from a non-hemispherical to a hemispherical surface;

depositing a metal silicide on said polysilicon layer; and patterning to form said polycide structure.

\* \* \* \* \*